(12) United States Patent
Subrahmanyan et al.

(10) Patent No.: US 10,381,256 B2
(45) Date of Patent: Aug. 13, 2019

(54) APPARATUS AND METHOD FOR CHUCKING WARPED WAFERS

(71) Applicant: KLA-TENCOR CORPORATION, Milpitas, CA (US)

(72) Inventors: Pradeep Subrahmanyan, Cupertino, CA (US); Luping Huang, Dublin, CA (US); Chris Pohlhammer, San Ramon, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 517 days.

(21) Appl. No.: 15/065,430

(22) Filed: Mar. 9, 2016

(65) Prior Publication Data

US 2016/0268156 A1    Sep. 15, 2016

Related U.S. Application Data

(60) Provisional application No. 62/132,473, filed on Mar. 12, 2015.

(51) Int. Cl.
*H01L 21/683* (2006.01)
*H01L 21/67* (2006.01)

(52) U.S. Cl.
CPC .... *H01L 21/6838* (2013.01); *H01L 21/67288* (2013.01)

(58) Field of Classification Search
CPC ........ B25B 11/00; B25B 11/02; B25B 11/005
See application file for complete search history.

(56) References Cited

U.S. PATENT DOCUMENTS

| | | | | |
|---|---|---|---|---|
| 5,374,829 A | * | 12/1994 | Sakamoto | C30B 25/12 250/453.11 |
| 6,196,532 B1 | * | 3/2001 | Otwell | B25B 11/005 269/21 |
| 6,286,822 B1 | * | 9/2001 | Blick | B24B 9/08 269/21 |
| 6,439,559 B1 | * | 8/2002 | Kinnard | B25B 11/007 269/21 |
| 6,672,576 B1 | * | 1/2004 | Walker | B23Q 16/001 269/21 |
| 7,292,427 B1 | | 11/2007 | Murdoch et al. | |
| 7,607,647 B2 | * | 10/2009 | Zhao | B25B 11/005 269/20 |
| 8,136,802 B2 | * | 3/2012 | Cho | B65G 47/91 248/205.9 |

(Continued)

FOREIGN PATENT DOCUMENTS

CN    103904011    7/2014
DE    102011001879    10/2012
(Continued)

*Primary Examiner* — Lee D Wilson
(74) *Attorney, Agent, or Firm* — Simpson & Simpson, PLLC

(57) ABSTRACT

An apparatus for fixing a wafer, including a chuck having a surface, a plurality of through bores in the chuck extending through the surface of the chuck, a fixed vacuum bellows, and a plurality of floating air bearings, wherein the fixed vacuum bellows and a respective floating air bearing of the plurality of floating air bearings are each individually arranged in separate through bores of the plurality of through bores and elevationally above the surface of the chuck.

10 Claims, 3 Drawing Sheets

(56) References Cited

U.S. PATENT DOCUMENTS

| | | | |
|---|---|---|---|
| 8,485,507 B2 * | 7/2013 | Inoue | B65G 49/061 269/21 |
| 2005/0011460 A1 | 1/2005 | Taniguchi | |
| 2012/0311848 A1 | 12/2012 | Park | |
| 2016/0163580 A1 | 6/2016 | Huang | |

FOREIGN PATENT DOCUMENTS

| | | |
|---|---|---|
| EP | 1685930 | 8/2006 |
| JP | 2005006931 | 1/2005 |
| JP | 2013243203 | 12/2013 |
| KR | 20040036610 | 4/2004 |
| WO | 2012/004002 | 1/2012 |
| WO | WO2014/101795 | 7/2014 |

* cited by examiner

APPARATUS AND METHOD FOR CHUCKING WARPED WAFERS

CROSS-REFERENCE TO RELATED APPLICATIONS

This application claims the benefit under 35 U.S.C. § 119(e) of U.S. Provisional Patent Application No. 62/132,473, filed Mar. 12, 2015, which application is incorporated herein by reference in its entirety.

TECHNICAL FIELD

The present invention relates to an apparatus and method for fixing wafers used in the manufacture of semiconductors to a chuck.

BACKGROUND

Wafers used for Advanced Wafer Level Packaging (aWLP) come in a variety of sizes and formats. For example, the thicknesses of aWLP wafers range from tens of microns to a few millimeters. Additionally, the wafers may be mounted on film frames, bonded to carrier wafers, or reconstituted onto packaging materials or other wafers. This diversity results in significant variation in wafer stiffness and warp, both of which adversely affect the ability of wafers to be fixed to a conventional chuck.

Conventional chucks use a vacuum to fix a wafer to the chuck. This method of fixation tends to preserve any warping in the wafer, as the wafer is drawn to the surface of the chuck without having an opportunity to flatten out through transverse extension of the warped portion of the wafer. Thus, a wafer fixed to a chuck in this way may not conform to the surface geometry of the chuck. Physical edge clamps which clamp the wafer directly to the chuck can improve the fixation of the wafer to the chuck by forcing the wafer to conform to the surface geometry of the chuck, however, physically clamping a wafer may generate debris particles or other contaminants.

As the optical inspection of wafers requires establishing a focus plane with high precision, warping in the wafer can cause portions of the wafer to be outside the desired focus plane. Further, the debris particles generated by physical clamping can contaminate the die, which in turn may negatively affect yield.

SUMMARY

According to aspects illustrated herein, there is provided an apparatus for fixing a wafer, including a chuck having a surface, a plurality of through bores in the chuck extending through the surface of the chuck, a fixed vacuum bellows, and a plurality of floating air bearings, wherein the fixed vacuum bellows and a respective floating air bearing of the plurality of floating air bearings are each individually arranged in separate through bores of the plurality of through bores and elevationally above the surface of the chuck.

According to aspects illustrated herein, there is provided a method for fixing a wafer to a chuck, including lowering the wafer to a position adjacent a surface of the chuck, coupling the wafer using a first negative air pressure to a fixed vacuum bellows arranged within a vacuum through bore in the surface of the chuck and elevationally above the surface of the chuck, suspending the wafer using a positive air pressure provided by a plurality of floating air bearings, wherein respective floating air bearings of the plurality of floating air bearings are arranged elevationally above the surface of the chuck and each individually arranged in separate through bores of a plurality of through bores in the chuck, coupling the wafer using a second negative air pressure to the plurality of floating air bearings, and clamping the wafer to the surface of the chuck by retracting the fixed vacuum bellows and the plurality of floating air bearings inside the chuck.

According to aspects illustrated herein, there is provided an apparatus for fixing a wafer, including a chuck having a surface, a plurality of through bores in the chuck extending through the surface of the chuck, at least two location pins arranged around an edge of the surface of the chuck in at least one direction substantially orthogonal to the surface of the chuck, a first floating air bearing arranged within a first through bore of the plurality of through bores, a second floating air bearing arranged within a second through bore of the plurality of through bores, and a fixed vacuum bellows arranged within a third through bore of the plurality of through bores.

BRIEF DESCRIPTION OF THE DRAWINGS

Various embodiments are disclosed, by way of example only, with reference to the accompanying schematic drawing in which.

DETAILED DESCRIPTION

At the outset, it should be understood that the disclosure as claimed is not limited to the disclosed aspects.

Furthermore, it is understood that this disclosure is not limited to the particular methodologies, materials and modifications described and as such may, of course, vary. It is also understood that the terminology used herein is for the purpose of describing particular aspects only, and is not intended to limit the scope of the present disclosure.

Unless defined otherwise, all technical and scientific terms used herein have the same meaning as commonly understood to one of ordinary skill in the art to which this disclosure belongs. It should be understood that any methods, devices or materials similar or equivalent to those described herein can be used in the practice or testing of the disclosure. As used herein, by "vacuum" it is generally meant a region or state of negative air pressure, for example, a region or state having a lower air pressure than an adjacent environment.

Figure 1:
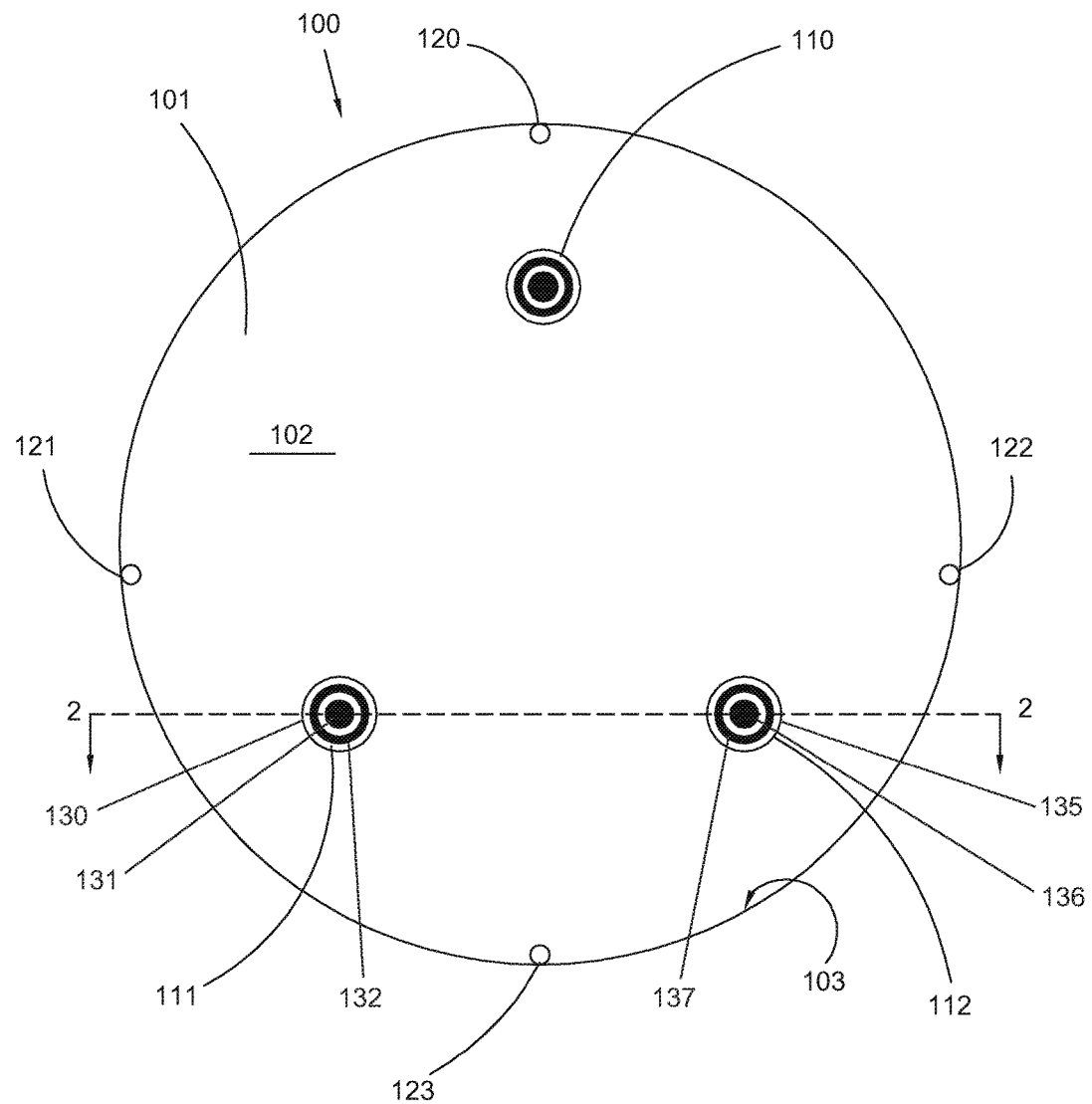
FIG. 1 is a top plan view of an apparatus for chucking wafers.

FIG. 1 is a top plan view of an apparatus 100 for chucking wafers. Apparatus 100 includes chuck 101, which has surface 102. In an example embodiment, chuck 101 has a surface geometry equivalent to a circular plane. Edge 103 is the outer edge of surface 102, and in an example embodiment, edge 103 is the circular boundary of surface 102, while surface 102 is a planar surface. Location pins 120, 121, 122, and 123 are arranged around and adjacent edge 103 in at least one direction substantially orthogonal to surface 102, for example, parallel with the surface normal of surface 102. In an example embodiment, there are at least two location pins arranged around edge 103 of surface 102 of chuck 101, and these at least two location pins are arranged in at least one direction substantially orthogonal to surface 102 of chuck 101.

Apparatus 100 includes floating air bearings 110 and 112 and fixed vacuum bellows 111. Floating air bearings 110 and 112 and fixed vacuum bellows 111 are each individually arranged in separate through bores in chuck 101. These through bores extend through surface 102. Further, floating air bearings 110 and 112 and fixed vacuum bellows 111 are initially arranged elevationally above surface 102. The function and movement of floating air bearings 110 and 112 and fixed vacuum bellows 111 are discussed in greater detail below. In some example embodiments, apparatus 100 includes more than two floating air bearings.

Figure 2:
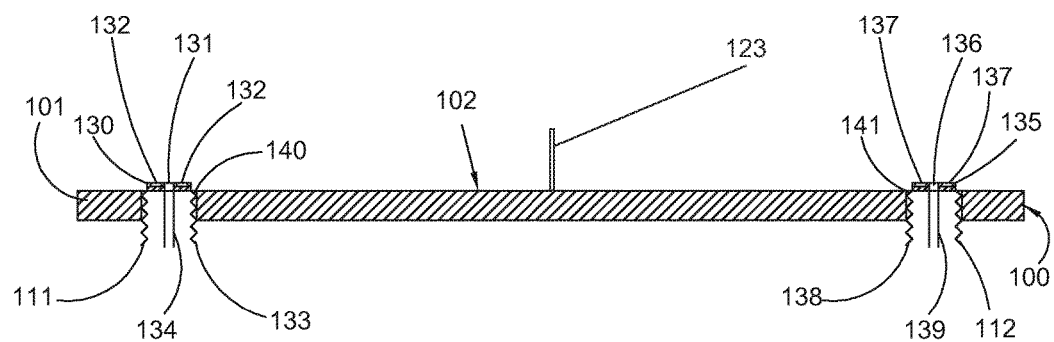
FIG. 2 is a cross-sectional view of the apparatus shown in FIG. 1 taken along line 2-2.

FIG. 2 is a cross-sectional view of apparatus 100 shown in FIG. 1 taken along line 2-2. Chuck 101 includes through bores 140 and 141, in which are arranged fixed vacuum bellows 111 and floating air bearing 112, respectively. Fixed vacuum bellows 111 includes vacuum pad 130 including through bore 131, bellows 133 connected to vacuum pad 130, and vacuum line 134 arranged within bellows 133 and connected to vacuum pad 130, such that vacuum line 134 is in fluid communication with through bore 131 in vacuum pad 130. In an example embodiment, bellows 133, and thus, fixed vacuum bellows 111 as an assembly, are both extendable and retractable in directions orthogonal to surface 102 of chuck 101, i.e., coaxial with the longitudinal axis of through bore 140.

Floating air bearing 112 includes air bearing pad 135 including through bore 136, bellows 138 connected to air bearing pad 135, at least one air bearing opening 137 in a surface of air bearing pad 135, an air line in fluid communication with at least one air bearing opening 137, and vacuum line 139 arranged within bellows 138 and connected to air bearing pad 135, wherein vacuum line 139 is in fluid communication with through bore 136 in air bearing pad 135. In an example embodiment, bellows 138, and thus floating air bearing 112 as an assembly, are both extendable and retractable in directions orthogonal to surface 102 of chuck 101, i.e., coaxial with the longitudinal axis of through bore 141. In an example embodiment, bellows 138 serves as the air line in fluid communication with at least one air bearing opening 137. In an example embodiment, the surface of air bearing pad 135 in which at least one air bearing opening 137 is arranged is a surface parallel to surface 102 of chuck 101. In an example embodiment, at least one air bearing opening 137 is an annular opening in the surface of air bearing pad 135. In on example embodiment, at least one air bearing opening 137 is a porous medium, e.g., porous metal or sintered metal particles.

In an example embodiment, fixed vacuum bellows 111 includes the same components as floating air bearing 112, i.e., fixed vacuum bellows 111 is one of the plurality of floating air bearings. This similarity in structure between vacuum bellows 111 and the floating air bearings, such as floating air bearing 112, reduces the complexity of apparatus 100 and the need to maintain separate sets of replacement parts.

Figure 3:
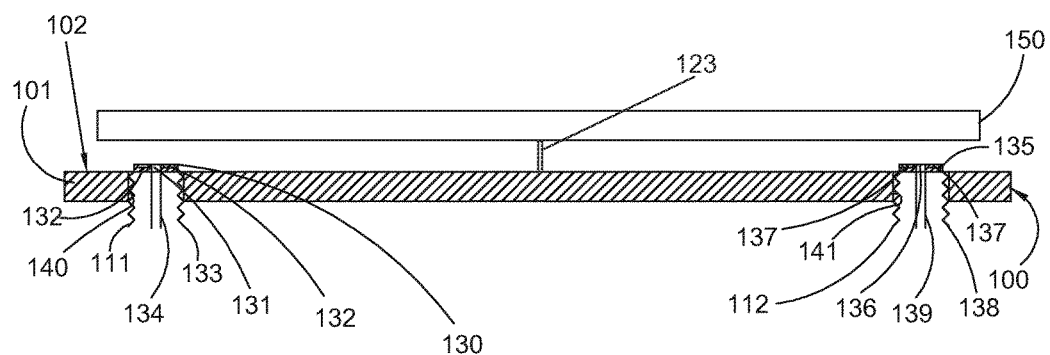
FIG. 3 is a cross-sectional view of e apparatus shown in FIG. 1 taken along line 2-2 including a wafer.

FIG. 3 is a cross-sectional view of apparatus 100 as shown in FIG. 2 including wafer 150 partially secured to apparatus 100. Wafer 150 is lowered to a position adjacent surface 102 of chuck 101. In an example embodiment, wafer 150 is lowered within a perimeter defined by the at least two location pins arranged around edge 103 of surface 102 of chuck 101.

Figure 4:
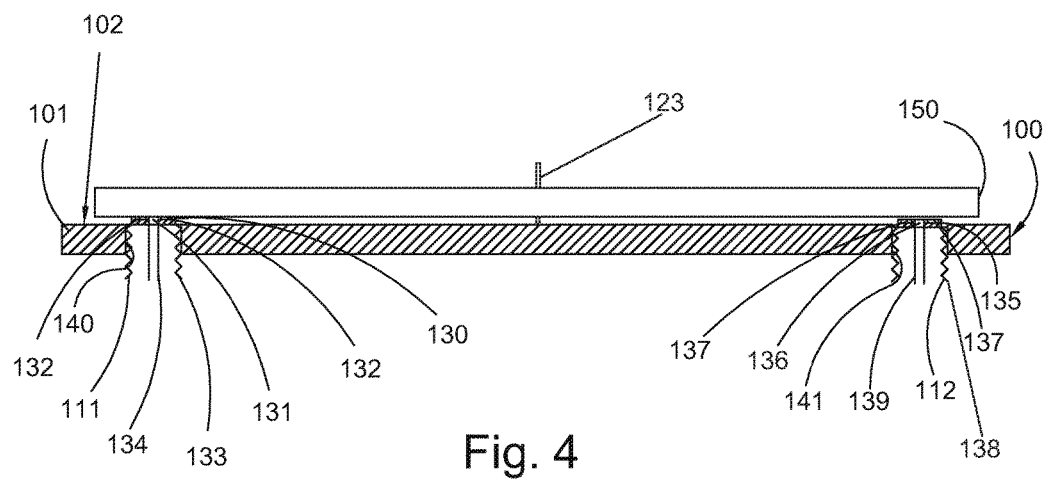
FIG. 4 is a cross-sectional view of the apparatus shown in FIG. 1 taken along line 2-2 including a wafer partially secured to the apparatus, i.e., secured at a single location; and, FIG. 5 is a cross-sectional view of the apparatus shown in FIG. 1 taken along line 2-2 with a wafer fixed to the surface of the chuck.

FIG. 4 is a cross-sectional view of apparatus 100 as shown in FIG. 2 including wafer 150. A first negative air pressure is provided between wafer 150 and vacuum pad 130. In an example embodiment, this first negative air pressure is created by a vacuum pump (not shown) in fluid communication with vacuum line 134 and through bore 131. This first negative air pressure tends to draw air into through bore 131 and through vacuum line 134 towards the vacuum pump. This first negative air pressure draws objects towards through bore 131 and thus, vacuum pad 130. Wafer 150 is brought into contact with vacuum pad 130 as a result of the first negative air pressure between wafer 150 and vacuum pad 130. Once wafer 150 is in contact with vacuum pad 130, the first negative air pressure between wafer 150 and vacuum pad 130 couples wafer 150 to vacuum pad 130 and thus, to fixed vacuum bellows 111 as an assembly. As fixed vacuum bellows 111 is arranged within through bore 140, fixed vacuum bellows 111 cannot move transversely relative to surface 102 of chuck 101. Thus, after coupling to fixed vacuum bellows 111, wafer 150 cannot move transversely relative to surface 102 of chuck 101.

A positive air pressure is provided between wafer 150 and air bearing pad 135. In an example embodiment, this positive air pressure is created by an air pump (not shown) in fluid communication with an air line and at least one air bearing opening 137. This positive air pressure tends to vent air from at least one air bearing opening 137. In an example embodiment, air vented from floating air bearing 112 and other floating air bearings in the plurality of air bearings vents directly to an atmospheric environment. The positive air pressure tends to repel objects away from at least one air bearing opening 137 and thus, away from air bearing pad 135. In this way, floating air bearing 112 serves as an air bearing, namely, an apparatus for providing a low-friction, load-bearing interface between two surfaces using positive air pressure. As wafer 150 is repelled from floating air bearing 112, but coupled to fixed vacuum bellows 111, the portion of wafer 150 generally above floating air bearing 112 is suspended elevationally above floating air bearing 112 by the positive air pressure.

In an example embodiment, a second negative air pressure is provided between wafer 150 and air bearing pad 135. This second negative air pressure is created by a vacuum pump (not shown) in fluid communication with vacuum line 139 and through bore 136. This second negative air pressure tends to draw air into through bore 136 and through vacuum line 139 towards the vacuum pump. This second negative air pressure draws objects towards through bore 136 and thus, air bearing pad 135. In an example embodiment, the effects of the positive air pressure and second negative air pressure created between wafer 150 and floating air bearing 112 are balanced, such that wafer 150 is drawn towards floating air bearing 112, but wafer 150 is not able to contact floating air bearing 112, i.e. the portion of wafer 150 immediately elevationally above floating air bearing 112 remains suspended by the positive air pressure.

The combined effects of the positive air pressure and second negative air pressure provided by floating air bearing 112 draw wafer 150 towards floating air bearing 112 while providing a low-friction interface between floating air bearing 112 and wafer 150. As wafer 150 is drawn towards floating air bearing 112, its natural tendency is to flatten out, removing any warping in wafer 150. As the warping in wafer 150 is removed, the dimensions of wafer 150 will change. In an example embodiment, these dimensional changes are generally in the nature of a decrease in the height and increase in the length and width of wafer 150. The tow-friction interface between wafer 150 and floating air bearing 112 permits the portions of wafer 150 generally devotionally above floating air bearing 112 to move transversely, relative to surface 102 of chuck 101, while suspended devotionally over floating air bearing 112. The ability of floating air bearing 112 and other floating air hearings in the plurality of floating air hearings to flatten wafer 150 is enhanced by the coupling of wafer 150 to fixed vacuum bellows 111, which coupling acts to securely anchor wafer 150 at a single point. This anchoring effect permits floating air bearing 112 and other floating air bearings in the plurality of floating air bearings to more effectively flatten the warping in wafer 150 while preventing wafer 150 as a whole from moving transversely relative to surface 102 of chuck 101.

After the warping in wafer 150 has been removed by the desired amount, the balance of the positive air pressure and second negative air pressure created between wafer 150 and floating air bearing 112 can be adjusted to couple wafer 150 to air bearing pad 135 and thus, to floating air bearing 112 as an assembly. In an example embodiment, wafer 150 is coupled to all floating air bearings in the plurality of floating air bearings. Such coupling may occur simultaneously at all floating air bearings or may occur individually in a serial or random order.

Figure 5:
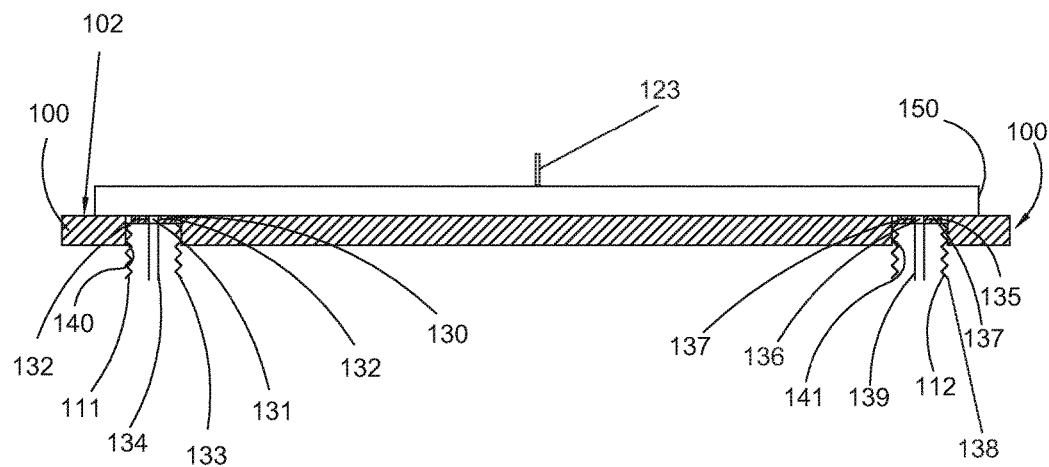

FIG. 5 is a cross-sectional view of apparatus 100 as shown in FIG. 2 with wafer 150 fixed to surface 102 of chuck 101. After wafer 150 has coupled to fixed vacuum bellows 111, floating air bearing 112, and other floating air bearings in the plurality of floating air bearings, bellows 133 and 138 and the bellows associated with other floating air hearings in the plurality of floating air bearings retract orthogonally into chuck 101, also retracting respective connected fixed vacuum bellows 111, floating air bearing 112, and other floating air bearings in the plurality of floating air bearings orthogonally into chuck 101. This retraction of fixed vacuum bellows 111, floating air bearing 112, and other floating air bearings in the plurality of floating air bearings clamps wafer 150 to surface 102 of chuck 101, as wafer 150 is coupled with the retracted fixed vacuum bellows ill and the plurality of floating air bearings. By flattening the warping in wafer 150 and clamping it to surface 102 of chuck 101, the surface geometry of chuck 101 is imparted to wafer 150. In an example embodiment, after this clamping occurs, the positive air pressure provided by floating air bearing 112 and other floating air bearings in the plurality of floating air bearings can be ceased.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. An apparatus for fixing a wafer, comprising:
   a chuck comprising a surface;
   a plurality of through bores in the chuck extending through the surface of the chuck;
   a fixed vacuum bellows; and,
   a plurality of floating air bearings, wherein the fixed vacuum bellows and a respective floating air bearing of the plurality of floating air bearings are each individually arranged in separate through bores of the plurality of through bores, each is configured for reciprocating movement within a respective through bore, and each includes a pad surface disposable from a position that is flush with the surface of the chuck and to a position that is above the surface of the chuck.

2. The apparatus of claim 1, wherein the plurality of floating air bearings comprises:
   a first floating air bearing arranged within a first through bore of the plurality of through bores; and,
   a second floating air bearing arranged within a second through bore of the plurality of through bores, wherein the fixed vacuum bellows is arranged within a third through bore of the plurality of through bores.

3. The apparatus of claim 1, wherein the fixed vacuum bellows comprises:
   a vacuum pad comprising a through bore;
   a bellows connected to the vacuum pad which is both extendable and retractable in directions orthogonal to the surface of the chuck; and,
   a vacuum line arranged within the bellows and connected to the vacuum pad, wherein the vacuum line is in fluid communication with the through bore in the vacuum pad.

4. The apparatus of claim 1, wherein a respective floating air bearing of the plurality of floating air bearings comprises:
   an air bearing pad comprising a through bore;
   a bellows connected to the air bearing pad which is both extendable and retractable in directions orthogonal to the surface of the chuck;
   at least one air bearing opening in a surface of the air bearing pad;
   an air line in fluid communication with the at least one air bearing opening; and,
   a vacuum line arranged within the bellows and connected to the air bearing pad, wherein the vacuum line is in fluid communication with the through bore in the air bearing pad.

5. The apparatus of claim 4, wherein the at least one air bearing opening is an annular opening in the surface of the air bearing pad.

6. The apparatus of claim 4, wherein the at least one air bearing opening is a porous medium.

7. The apparatus of claim 1, further comprising:
   at least two location pins arranged around an edge of the surface of the chuck in at least one direction substantially orthogonal to the surface of the chuck.

8. The apparatus of claim 1, wherein the plurality of floating air bearings vent directly to an atmospheric environment.

9. The apparatus of claim 1, wherein the fixed vacuum bellows comprises one of the plurality of floating air bearings.

10. An apparatus for fixing a wafer, comprising:
    a chuck comprising a surface;
    a plurality of through bores in the chuck extending through the surface of the chuck;
    at least two location pins each arranged proximate an edge of the surface of the chuck and extending above the surface of the chuck in a direction substantially orthogonal to the surface of the chuck;
    a first floating air bearing arranged within a first through bore of the plurality of through bores;
    a second floating air bearing arranged within a second through bore of the plurality of through bores; and,
    a fixed vacuum bellows arranged within a third through bore of the plurality of through bores, wherein one or more of the first floating air bearing, the second floating air bearing, and fixed vacuum bellows include a pad surface configured for reciprocating movement between a position that is flush with the surface of the chuck and to a position that is above the surface of the chuck.

* * * * *